July 29, 1952 E. EBERHARD 2,605,306

SEMICONDUCTOR MULTIVIBRATOR CIRCUIT

Filed Oct. 15, 1949 2 SHEETS—SHEET 1

Inventor
Everett Eberhard

By H. W. Weston

Attorney

July 29, 1952 E. EBERHARD 2,605,306

SEMICONDUCTOR MULTIVIBRATOR CIRCUIT

Filed Oct. 15, 1949 2 SHEETS—SHEET 2

Inventor

Everett Eberhard

By

Attorney

Patented July 29, 1952 2,605,306

UNITED STATES PATENT OFFICE 2,605,306

SEMICONDUCTOR MULTIVIBRATOR CIRCUIT

Everett Eberhard, Haddonfield, N. J., assignor to Radio Corporation of America, a corporation of Delaware Application October 15, 1949, Serial No. 121,552

22 Claims. (Cl. 171—97)

This invention relates generally to relaxation oscillators, and particularly relates to multivibrator circuits including semi-conductor devices.

The three-electrode semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948 issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

A multivibrator circuit is a relaxation oscillator and may be classified according to its operation in three different types. One type of multivibrator may be arranged to be free running or self-oscillating at a predetermined frequency. The other two types of multivibrators have to be triggered by externally applied electric impulses. Thus, the multivibrator may be monostable or of the one-cycle type. In other words, when the multivibrator is triggered it will go through one cycle of oscillation whereupon it returns to the original stable state of operation. The multivibrator remains in that stable state until it is triggered again by the next pulse. Finally, a multivibrator may be bistable, in which case it is sometimes known as a flip-flop circuit. A flip-flop circuit may be defined as an Eccles-Jordan or direct-coupled multivibrator having two conditions of stable equilibrium. The bistable multivibrator is triggered by successive trigger pulses from one stable condition to its other stable condition. A bistable multivibrator may find application in electronic impulse counters, computers and the like devices.

It is accordingly a principal object of the present invention to provide novel multivibrator circuits which include two semi-conductor devices or amplifiers and which may provide effective free running, monostable or bistable operation.

A further object of the invention is to provide multivibrator circuits of the semi-conductor type which make use of the negative resistance of semi-conductor devices to accelerate the transition of high conductivity from one portion to another portion of such circuits for improved multivibrator action.

Another object of the invention is to provide a monostable multivibrator circuit which may be converted to a free running oscillator by a suitable choice of the operating potentials.

Still a further object of the invention is to provide a bistable multivibrator circuit suitable as an impulse counter and which may be triggered from one stable state of operation to its other stable operating state by the application of trigger pulses of positive or negative polarity so that mixed positive and negative pulses may be counted.

A multivibrator circuit in accordance with the present invention comprises a first and a second semi-conductor device. Each device includes a semi-conducting body such as a block of germanium crystal having a base electrode, a collector electrode and an emitter electrode in contact therewith. The usual biasing voltages are applied to each of the two devices, that is, a reverse bias voltage is impressed between collector and base electrodes while a forward bias voltage is applied between emitter and base electrodes of each device. The base electrodes are grounded through a pair of resistors. Under predetermined operating conditions a negative resistance is thus provided looking into the base electrodes which promotes the rapid transition from one stable state of conduction to the other state of conduction of the circuit. The collector electrodes are also provided with resistors.

Finally, the collector electrode of the first device is connected to the base electrode of the second device through an impedance element, such as a capacitor or a resistor. If the collector electrodes of one device and the base electrodes of the other device are cross-connected by capacitors, a free running multivibrator results. On the other hand, if only the collector electrode of one device is coupled to the base electrode of the second device by a capacitor, the resulting multivibrator circuit will be monostable. Finally, a bistable multivibrator may be obtained by cross-connecting the collector electrode of one device and the base electrode of the other device by resistors. These resistors will hold the multivibrator circuit in each of its stable states of operation.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
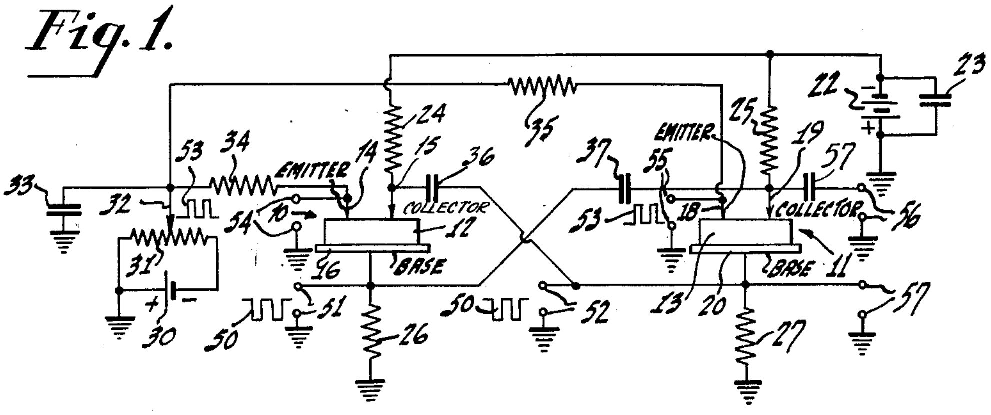
Figure 1 is a circuit diagram of a free-running multivibrator circuit embodying the present invention.

Referring, now to the drawings, in which like components have been designated by the same reference numerals throughout the figures, and particularly to Fig. 1, there is illustrated a free running multivibrator circuit in accordance with the invention comprising a first semi-conductor device 10 and a second semi-conductor device 11. The first semi-conductor device 10 includes body 12 of semi-conducting material which may consist, for example, of boron, silicon, germanium, tellurium or selenium containing a small but sufficient number of atomic impurity centers or lattice imperfections as commonly employed for best results in crystal rectifiers. Germanium is the preferred material for body 12 and may be prepared, so as to be an electronic N-type semi-conductor, as is well known. The surface of semi-conducting body 12 may be polished and etched in a conventional manner. It is also feasible to utilize the germanium block from a commercial high-back-voltage germanium rectifier such as the type 1N34, in which case further surface treatment may not be required. Body 13 of the second semi-conductor device 11 may consist of the same material as does body 12.

Semi-conducting body 12 of the first semi-conductor device 10 is provided with emitter electrode 14, collector electrode 15 and base electrode 16. Emitter electrode 14 and collector electrode 15 are usually small-area electrodes and may be point contacts consisting, for example, of tungsten or phosphor-bronze wires having a diameter of the order of 2 to 5 mils with a pointed tip. However, it is not essential that emitter electrodes 14 and collector electrodes 15 are small-area electrodes provided they make rectifying, high-resistance contacts with body 12. Emitter and collector electrodes 14 and 15 are ordinarily placed closely adjacent to each other on the same surface of body 12 or on opposite surfaces thereof in which case they may be separated by a distance of from 2 to 5 mils. Base electrode 16 provides a low-resistance, non-rectifying contact with the bulk material of semi-conducting body 12 and usually is a large-area electrode. Similarly, the second semi-conductor device 11 is provided with emitter electrode 18, collector electrode 19 and base electrode 20 which may be constructed and arranged in the same manner as the corresponding electrodes of device 10.

A comparatively large, reverse bias voltage is impressed between associated collector and base electrodes. Thus, assuming that bodies 12 and 13 consist of N-type germanium, which is presumed to have a P-type surface layer, the collector electrodes must be biased negatively with respect to their associated base electrodes. To this end, there is provided battery 22 having its positive terminal grounded, and bypassed for alternating-frequency currents by capacitor 23. The negative terminal of battery 22 is connected to collector electrode 15 through resistor 24 and also to collector electrode 19 through resistor 25. Resistors 26 and 27 individually connect base electrodes 16 and 20, respectively, to ground.

A comparatively small, forward bias voltage must be provided between the emitter electrodes and their associated base electrodes. Assuming, again, that bodies 12 and 13 consist of N-type germanium, which is assumed to have a P-type surface layer, the emitter electrodes must normally have a positive potential with respect to their associated base electrodes. However, base electrodes 16 and 20 are at a negative potential with respect to ground because the collector current flowing through base resistors 26 and 27, respectively, causes a voltage drop across these resistors. Accordingly, emitter electrodes 14 and 18 must be maintained at a negative potential with respect to ground so that they have the desired small positive potential with respect to their base electrodes. To this end, there is provided battery 30 having its positive terminal grounded and across which potentiometer resistor 31 is connected. An adjustable negative voltage may be obtained by tap 32 on potentiometer 31, the tap being grounded for alternating-frequency currents by capacitor 33. Tap 32 is connected to emitter electrodes 14 and 18 through individual resistors 34 and 35, respectively. The main purpose of resistors 34 and 35 is to limit the current which is permitted to flow through the emitter electrodes.

In accordance with the present invention capacitor 36 is connected between collector electrode 15 and base electrode 20, that is, between the collector electrode of the first device 10 and the base electrode of the second device 11. Similarly, capacitor 37 is connected between collector electrode 19 and base electrode 16, that is, between the collector electrode of the second device 11 and the base electrode of the first device 10.

Figure 2:
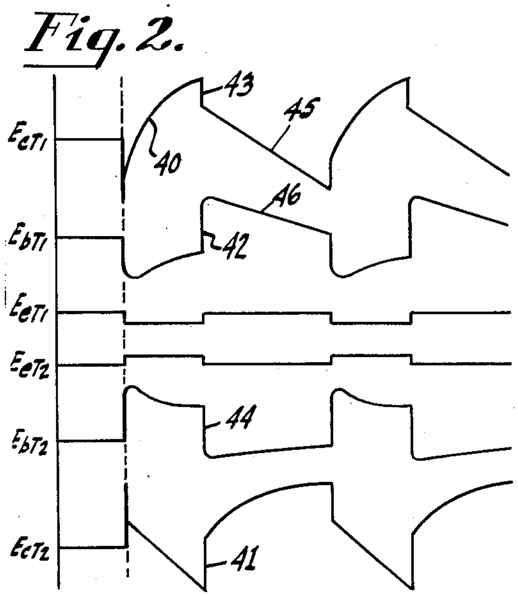
Figure 2 is a graph illustrating the voltages at the electrodes of the two semi-conductor devices of the circuit of Figure 1.

The operation of the free-running multivibrator circuit of Figure 1 will best be understood by reference to Figure 2 indicating the voltages on all electrodes of devices 10 and 11 with respect to time. Thus, $E_{cT1}$, $E_{bT1}$, $E_{eT1}$, $E_{eT2}$, $E_{bT2}$, $E_{cT2}$ indicate, respectively, the collector voltage, the base voltage and the emitter voltage of the first device 10, and the emitter voltage, base voltage and collector voltage of the second device 11.

Let it now be assumed that the first device 10 is conducting current heavily while the second device 11 is conducting current lightly. Under these conditions, the collector voltage of the first device 10 ($E_{cT1}$) increases in a positive direction due to the voltage drop across resistor 24 as shown by curve portion 40 of Fig. 2. Curve portion 40 of Fig. 2 is curved because coupling capacitor 36 must discharge the negative charge previously accumulated during the preceding half cycle through resistor 27. Let it now be assumed that for some reason the collector current of the second device 11 increases slightly. This will cause the voltage at collector electrode 19 to go in a positive direction, as shown by curve portion 41, Fig. 2. This rise of the collector voltage is impressed through capacitor 37 to base electrode 16 causing the base voltage to rise as shown by curve portion 42 of Fig. 2. However, as soon as the voltage of base electrode 16 rises, the collector current of device 10 will decrease due to the decreased positive potential between its emitter and base electrodes. This change in current causes a drop of the voltage of collector electrode 15 as shown by curve portion 43, which is now impressed through capacitor 36 on base electrode 20 of the second device 11. Curve portion 44, Fig. 2, illustrates that the voltage of base electrode 20 now decreases. This will produce in turn a still further increase of the collector current of device 11 so that device 11 will very rapidly conduct current heavily while device 10 will have a very light current conduction.

The feedback paths including capacitors 36 and 37 are accordingly regenerative. This regenerative feedback is further increased by the negative resistance which appears looking into the base electrodes due to the provision of base resistors 26 and 27. Base resistors 26, 27 provide regeneration since an increase in collector current causes the base voltage to go in a negative direction which in turn produces more emitter current and consequently still more collector current. Thus, the transition from one state of current conduction to the other state is very rapid.

Device 11 will now continue to conduct heavily while device 10 will conduct lightly. However, this condition will only last until capacitor 36 is charged from battery 22 through resistor 24 to a negative voltage, as evidenced by curve portion 45 of Fig. 2. At the same time, capacitor 37 is discharged through base resistor 26 so that the voltage of base electrode 16 will also fall as shown by curve portion 46, together with that of collector electrode 15. Eventually, the potential between collector electrode 15 and base electrode 16 becomes sufficiently large and the potential between emitter electrode 18 and base electrode 16 becomes sufficiently positive to increase again the collector current of device 10 whereupon device 10 will again quickly reach its stable state of heavy current conduction while device 11 will conduct comparatively lightly.

The relative widths of consecutive half cycles of the oscillator may be controlled by choosing the capacitances of capacitors 36 and 37. At the same time resistors 24 and 25 control the time required to charge the capacitors, while resistors 26 and 27 control the time required to discharge the capacitors. Thus, the relative resistances of resistors 24 and 25 as well as those of resistors 26 and 27 will also control the relative widths of consecutive half cycles of the oscillator.

It will be obvious that the multivibrator of Fig. 1 may be synchronized by externally applied trigger pulses. Trigger pulses of negative polarity, as shown at 50, may be impressed at input terminals 51 connected across base resistor 26. Alternatively, negative trigger pulses 50 may be impressed on input terminals 52 connected across base resistor 27. Thus, the circuit of Fig. 1 may be triggered by the application of negative pulses to either base electrode. Alternatively, positive trigger pulses, such as shown at 53, may be applied to either emitter electrode through input terminals 54 or 55. The multivibrator of Fig. 1 may also be used as a frequency divider or counter. In that case, the circuit constants should be chosen so that the natural period of the circuit is longer than the period of the input trigger pulses. Thus, the output frequency of the circuit of Fig. 1 may be a sub-multiple of the trigger frequency. A sawtooth output wave $E_{cT2}$ (Fig. 2) may be derived from output terminals 56 one of which is coupled by capacitor 57 to collector electrode 19. Alternatively, a square wave $E_{bT2}$ (Fig. 2) may be derived from output terminals 57 connected across base resistor 27. Square-topped pulses such as shown at $E_{eT1}$ and $E_{eT2}$ may be obtained from the two emitter electrodes.

While it will be understood that the circuit specifications of the multivibrator of Fig. 1 in accordance with the invention may vary according to the design for any particular application, the following circuit specifications are included, by way of example only, as suitable for a free-running frequency of 1180 cycles per second:

| | | |
|---|---|---|
| Resistor 26 | ohms | 1000 |
| Resistor 27 | do | 1000 |
| Resistor 24 | do | 33,000 |
| Resistor 25 | do | 33,000 |
| Resistor 34 | do | 150 |
| Resistor 35 | do | 150 |
| Capacitor 36 | microfarad | .05 |
| Capacitor 37 | do | .1 |

The D. C. bias conditions are as follows:

| | Volts |
|---|---|
| Collector electrode 15 | —38 |
| Collector electrode 19 | —18 |
| Emitter electrode 14 | —1 |
| Emitter electrode 18 | —1 |
| Base electrode 16 | —.9 |
| Base electrode 20 | —1.0 |

The peak-to-peak voltage developed at the collector of device 10 is 8 volts while that developed at the collector of device 11 is 5 volts. The peak-to-peak base voltages are 3 volts. The peak-to-peak emitter voltage of device 10 is .25 volt and that of device 11 is .35 volt.

Figure 3:
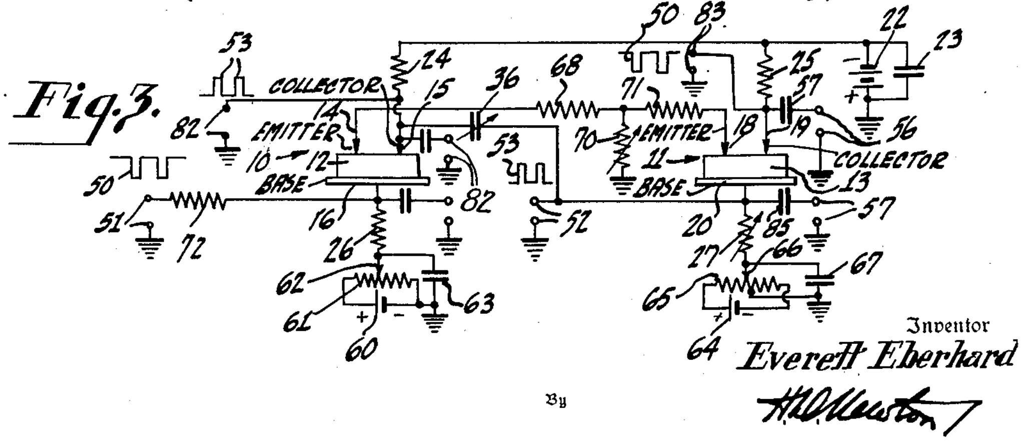
Figure 3 is a circuit diagram of a monostable multivibrator circuit in accordance with the invention.

Referring now to Figure 3, there is illustrated a monostable multivibrator circuit. The circuit of Fig. 3, of course, has to be unsymmetrical because the circuit has but a single state of stable operation. The two collector electrodes 15 and 19 are connected through individual resistors 24 and 25, respectively, to the negative terminal of battery 22. The bias potential between the emitter electrodes and their associated base electrodes is now applied individually to the base electrodes. To this end battery 60 has its negative terminal grounded and resistor 61 is connected across the battery. Base resistor 26 is connected to variable tap 62 on resistor 61 which may be grounded for alternating-frequency currents by bypass capacitor 63. Similarly, battery 64 is provided for supplying the required bias voltage between the emitter and base electrodes of device 11. Resistor 65 is connected across battery 64 and has its midpoint grounded; variable tap 66 is connected to base resistor 27 and may also be bypassed to ground by bypass capacitor 67. Emitter electrode 14 is grounded through resistors 68 and 70 connected in series. Emitter electrode 18 is grounded through resistor 71 and 70. Accordingly both emitter currents flow through resistor 70. Resistors 68 and 71 are not essential for the operation of the circuit of Figure 3 and may therefore be omitted.

In accordance with the present invention capacitor 36 is connected between collector electrode 15 and base electrode 20. However, no connection is provided between the collector electrode of device 11 and the base electrode of device 10.

Normally, device 11 is biased in such a manner as to conduct heavily while device 10 is biased to conduct lightly. To this end, tap 66 is normally at or near ground potential. On the other hand, positive voltage is supplied to base electrode 16 through variable tap 62 which is equivalent to a negative emitter bias voltage. Furthermore, collector resistor 25 preferably has a lower resistance than collector resistor 24 thereby permitting a higher collector current to flow through device 11 than through device 10.

Figure 4:
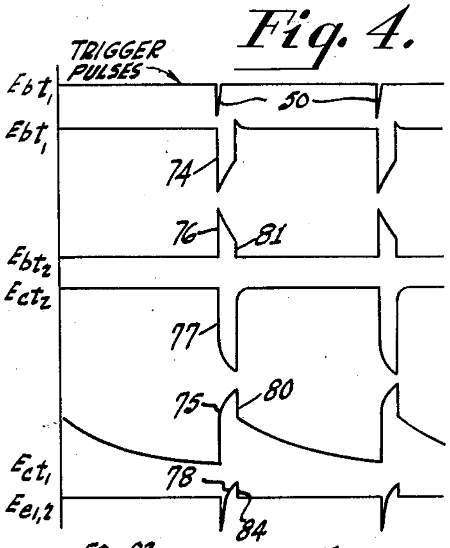
Figure 4 is a graph illustrating the voltages developed at the electrodes of the two semi-conductor devices of the circuit of Figure 3.

In a quiescent condition device 11 is accordingly conducting heavily while device 10 conducts lightly. This is a stable condition because the negative bias voltage developed across resistor 70 due to the high emitter current in device 11 holds device 10 to a low value of collector current in view of its positive base bias voltage. The circuit of Figure 3 may now be triggered, for example, by the application of a negative trigger pulse 50 on base electrode 16. The trigger pulse may be applied to the input terminals 51, one of which is connected to the base electrode through a series resistor 72. The negative trigger pulses 50 are also illustrated in Figure 4 to which reference is now made. The voltages of the various electrodes are again designated by the same symbols which have been used before.

The application of a negative trigger pulse 50 now causes the potential of base electrode 16 to drop as shown by curve portion 74. This in turn causes device 10 to conduct more heavily whereupon its collector voltage goes in a positive direction as shown by curve portion 75. This positive pulse developed at collector electrode 15 is then applied through capacitor 36 to base electrode 20 which will also go in a positive direction as shown by curve portion 76. This in turn decreases the collector current of device 11 whereupon the voltage of collector electrode 19 decreases as shown by curve portion 77. This decrease of the collector current of device 11 will also reduce the emitter current which flows through resistor 70. Both emitter voltages will accordingly go first in a negative direction due to application of the negative trigger pulse and then in a positive direction as shown by curve portion 78. This, in turn, will aid device 10 to increase its current further until finally device 10 draws a high current while device 11 is nearly cut off.

This condition continues until the positive charge of capacitor 36 leaks off sufficiently through base resistor 27 to ground. This causes the voltage of base electrode 20 to drop exponentially as shown by curve portion 81. Finally the potential of base electrode 20 reaches the point where device 11 begins to conduct. The increase in emitter current in device 11 now causes the voltage across resistor 70 to go in a negative direction as shown by curve portion 84 of Fig. 4. This decreases the current in device 10 causing the voltage of collector electrode 15 and likewise the voltage of base electrode 20 of device 11 to go in a negative direction. This causes a still larger current flow in device 11 and hence the process is regenerative and will proceed until device 11 is conducting fully and device 10 is again in low conduction. It will be noted that the emitter current of device 11 must be greater than that in device 10 so that the necessary voltage drop can be developed across resistor 70. The circuit is again in a stable condition which will continue until the next trigger pulse is applied.

It will be readily seen that the circuit of Figure 3 may also be triggered by the application of positive trigger pulses 53 to base electrode 20 through input terminals 52. This will be apparent from an inspection of the curves of Fig. 4 which show that the voltages at the two base electrodes go in opposite directions. Alternatively, positive trigger pulses 53 may be applied through input terminals 82 to collector electrode 15. Finally, negative trigger pulses 50 may be applied through input terminals 83 to collector electrode 19. This operation will also be evident from an inspection of Figure 4 which shows that the collector voltages of the two devices also go in opposite directions.

Output pulses may be derived from collector electrode 19 through output terminals 56 or from base electrode 20 through output terminals 57, one of which is coupled to the base electrode through coupling capacitor 85. The circuit of Fig. 3 accordingly produces a comparatively wide output pulse upon the arrival of each trigger pulse.

The width of the output pulses may be controlled, for example, by varying the capacitance of capacitor 36 and the resistance of resistor 27. In this case, it is assumed that the bias voltages remain constant. On the other hand, if the capacitance of capacitor 36 and the resistance of resistor 27 are fixed, the pulse width may be varied by varying the bias voltages applied to the two base electrodes. This may be effected by varying taps 62 or 66. Finally, the pulse width may be controlled by varying the voltage across resistor 70, that is, by varying its resistance.

It is also feasible to adjust the bias voltage applied through variable tap 62 to base electrode 16 in such a manner that a fairly heavy current may flow in device 10. In that case, the circuit of Figure 3 may be made to be self-oscillating and such a free-running multivibrator need not be triggered.

By way of example, the monostable multivibrator of Fig. 3 may have the following circuit specifications:

| | |
|---|---|
| Resistor 24 | 33,000 ohms |
| Resistor 25 | 12,000 ohms |
| Resistor 26 | 3,300 ohms |
| Resistor 61 | 1,000 ohms |
| Resistor 27 | 3,300 ohms |
| Resistor 70 | 1,000 ohms |
| Resistor 72 | 15,000 ohms |
| Capacitor 36 | .05 microfarad |
| The frequency of trigger pulses | 150 cycles per second |
| Width of trigger pulses | 2 microseconds |
| Width of output pulses | 230 microseconds |

D. C. bias conditions of the various electrodes are as follows:

| | Volts |
|---|---|
| Collector electrode 15 | −22 |
| Collector electrode 19 | − 5 |
| Base electrode 16 | − .2 |
| Base electrode 20 | − 2.8 |
| Emitter electrode 14 | − 2.5 |
| Emitter electrode 18 | − 2.5 |

The peak-to-peak voltage developed at base electrode 16 is 9 volts, while that developed at base electrode 20 amounts to 17 volts. The peak-to-peak voltages at the two collector electrodes 15 and 19 is 22 and 25 volts, respectively. The pea-to-peak voltages at each of the two emitter electrodes 14 and 18 amount to 6 volts.

Figure 5:
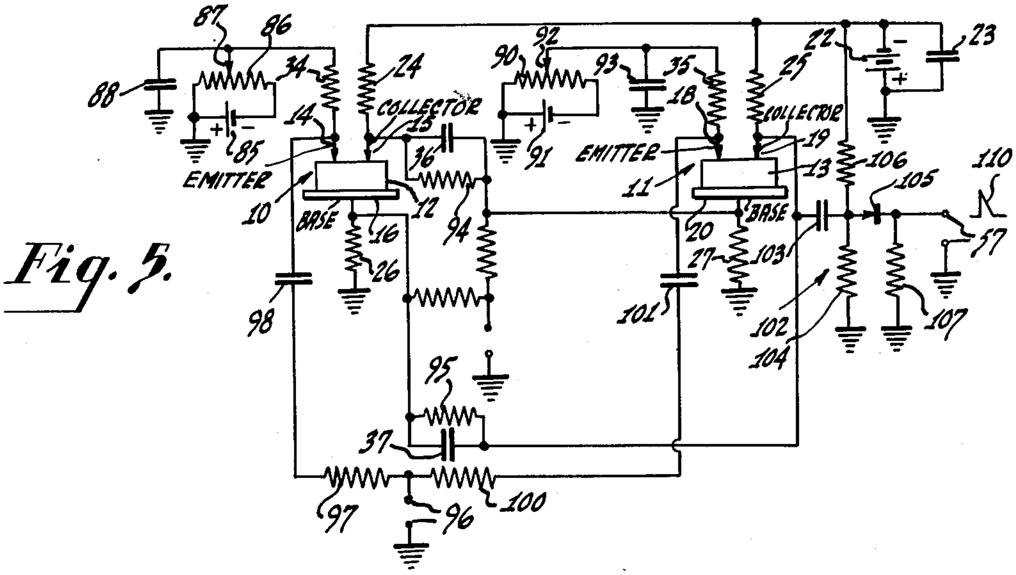
Figure 5 is a circuit diagram of a bistable multivibrator circuit in accordance with this invention.

Figure 5 to which reference is now made, illustrates a bistable multivibrator, that is, a multivibrator of the flip-flop type. The multivibrator circuit of Figure 5 again consists of two semi-conductor devices 10 and 11. The two collector electrodes 15 and 19 are connected through individual resistors 24 and 25, respectively, to the negative terminal of battery 22. Base electrodes 16 and 20 are connected to ground through individual base resistors 26 and 27, respectively, thereby to provide positive feedback. The two emitter electrodes 14 and 18 are individually biased by separate batteries. Thus, battery 85 has connected thereacross potentiometer 86. The positive terminal of battery 85 is grounded so that an adjustable negative voltage may be obtained from tap 87 on potentiometer 86 connected to emitter electrode 14 through series resistor 34. Tap 87 may be bypassed to ground by capacitor 88. Similarly, potentiometer resistor 90 is connected across battery 91 which has its positive terminal grounded. An adjustable negative voltage may be derived from variable tap 92 on potentiometer 90 which is connected to emitter electrode 18 through series resistor 35. Variable tap 92 may be bypassed to ground for alternating-frequency currents by bypass capacitor 93.

In accordance with the present invention resistor 94 is connected between collector electrode 15 of semi-conductor device 10 and base electrode 20 of semi-conductor device 11. Similarly, resistor 95 is connected between collector electrode 19 of semi-conductor device 11 and base electrode 16 of semi-conductor device 10. Resistors 94 and 95 may be individually shunted by capacitors 36 and 37, respectively. However, capacitors 36 and 37 are not essential for the operation of the multivibrator of Figure 5 and may, therefore, be omitted. On the other hand, the capacitors provide a better feedback at higher frequencies and thus increase the rapidity of the transfer of current from one of the two devices to the other.

Trigger pulses which may either be of positive or negative polarity may be impressed on input terminals 96. One of the input terminals is grounded while the other one is connected through resistor 97 and capacitor 98 to emitter electrode 14 and through resistor 100 and capacitor 101 to emitter electrode 18. The trigger pulses are accordingly applied simultaneously to both emitter electrodes 14 and 18 through filter resistors 97, 100 and blocking capacitors 98, 101.

The output pulses may be derived, for example, from collector electrode 19. These output pulses may be obtained from output terminals 57. Preferably, the output pulses are passed through a differentiating network 102 including series capacitor 103 and shunt resistor 104. Accordingly, a positive kick will be developed at the leading edge of an output pulse and a negative kick will be developed at the trailing edge of the output pulse. If output pulses of one polarity only are desired, the output kicks may be passed through a clipper such as diode rectifier 105. The diode rectifier 105 preferably is maintained at a negative bias voltage through resistor 106 connected between the negative terminal of battery 22 and the junction point of crystal rectifier 105 and resistor 104. Resistors 106 and 104 accordingly form a voltage divider for impressing a predetermined negative bias voltage on the crystal rectifier. Resistor 107 connected between the output electrode of crystal rectifier 105 and ground completes the DC path for the rectifier. Accordingly, positive output pulses indicated at 110 may be derived from the circuit of Fig. 5.

The multivibrator circuit of Fig. 5 has two stable states of operation. In either state, one of the semi-conductor devices 10 or 11 conducts current heavily while the other will conduct lightly. Thus, let it be assumed that semi-conductor device 10 conducts heavily while semi-conductor device 11 conducts lightly. Curve 111 of Figure 7 indicates the collector voltage of device 10 as indicated by $E_{cT1}$. Curve 112 indicates the collector voltage of device 11 as indicated by the symbol $E_{cT2}$. Thus, when device 10 conducts heavily, its collector voltage increases in a positive direction as clearly shown by curve 111. Accordingly, a positive voltage is impressed on base electrode 20 through resistor 94 which, in turn, decreases the current conduction through semi-conductor device 11. Consequently, the voltage of collector electrode 19 goes in a negative direction which in turn tends to make the voltage of base electrode 16 negative in view of the connection of the two electrodes through resistor 95. This stable state of operation will continue until a trigger pulse is impressed on input terminals 96.

Figure 6:
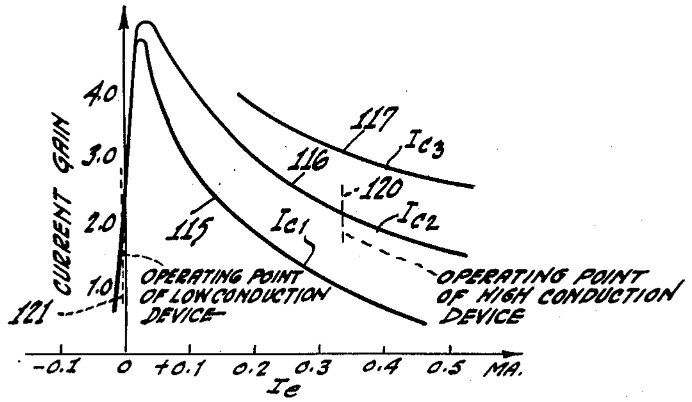
Figure 6 is a graph showing curves which will be referred to in explaining the operation of the circuit of Fig. 5.
Figure 7:
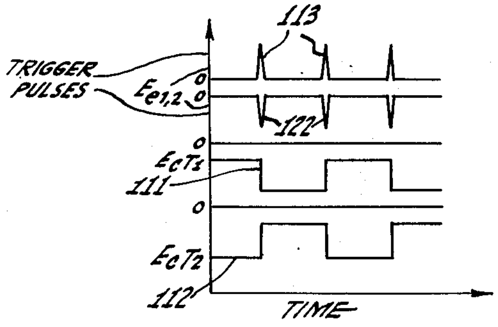
Figure 7 is a graph illustrating the voltages at some of the electrodes of the two semi-conductor devices of the circuit of Figure 5.

Let it now be assumed that the trigger pulses have positive polarity, as shown by curve 113 of Fig. 7. A positive trigger pulse is now impressed simultaneously on both emitter electrodes 14 and 18. To explain the further operation of the multivibrator circuit of Fig. 5 reference is now made to Fig. 6 wherein curves 115, 116 and 117 indicate the emitter current $I_e$ with respect to the current gain of the device. As indicated in Fig. 6 the curves 115 to 117 have been taken with different values of collector current $I_{c1}$, $I_{c2}$ and $I_{c3}$. The curve 115 corresponds to a collector current $I_{c1}$ of approximately 1 milliampere, while curve 117 corresponds to a collector current $I_{c3}$ of approximately 2 milliamperes. The dotted lines 120 and 121 indicate the operating points of the high conduction device and of the low conduction device, respectively.

Positive trigger pulses 113 tend to increase the emitter current $I_e$. Since device 10 has been assumed to be conducting heavily its emitter electrode 14 is at the operating point indicated by the dotted line 120. The positive trigger pulse 113 will tend to increase its emitter current and thus shift the operating conditions to a region of lower current gain. The trigger pulse will, accordingly, have no effect on device 10. However, device 11 operates in the low conduction state corresponding to dotted line 121. The positive trigger pulse tends to shift the operating conditions of device 11 into a region of higher current gain. From this it will be clear that the effect of the positive pulse on device 11 is much greater than its effect on device 10. The positive pulse 113 impressed on device 11 tends to increase its current and as soon as the current through semi-conductor device 11 increases, the current conduction through device 10 will tend to decrease in accordance with the well known multivibrator action. Thus, upon the arrival of a trigger pulse the voltage of collector electrode 19 will increase in a positive direction. This, in turn, will make base electrode 16 more positive which, in turn, tends to reduce the current through device 10. Consequently, the voltage of collector electrode 15 increases in a negative direction which tends to make base electrode 20 more negative which, in turn, increases the current through device 11 still further.

Upon the arrival of the next trigger pulse the cycle of operation repeats again. In other words, the positive trigger pulse will have little effect on the device which previously was in its high conduction state but it will trigger the device which was in the low conduction state to the high conduction state and this, in turn, will bring the high conduction device into the low conduction state.

Let it now be assumed that negative trigger pulses 122 (Fig. 7) are impressed through input terminals 96 on emitter electrodes 14 and 18. In this case, the trigger pulses will tend to reduce the emitter current. Thus the device which operates in the low conduction state, as shown by dotted line 121 (Fig. 6), will be shifted to a still lower emitter current value and thus will be further shifted toward a low gain condition. Accordingly, a negative trigger pulse will have little effect on the device which operates in the low conduction state. However, if the negative trigger pulse is applied to the device in the high conduction state it will tend to reduce the emitter current thus shifting the operating conditions to a high gain region. Hence the device in high conduction will have its current reduced to a low value. It will accordingly be seen that the multivibrator of Figure 5 may be triggered by the application of either positive or negative trigger pulses on both emitter electrodes. Alternatively, trigger pulses of either polarity may be applied to both base electrodes or to both collector electrodes as will be readily apparent. This is so because a change of the base or of the collector voltage may always be interpreted as a corresponding change of the emitter voltage.

It is to be understood that not all semi-conductor devices have a relation between emitter current and current gain as illustrated in Fig. 6. However, approximately three-quarters of the semi-conductor devices have such properties and are therefore suitable for positive or negative triggering in the multivibrator circuit of Fig. 5. Semi-conductor devices without the peaked current gain curve of Figure 6 may be used in the multivibrator circuit of Figure 5 but will not permit triggering with pulses of either polarity.

By way of example, the multivibrator of Fig. 5 may have the following circuit specifications:

| | | |
|---|---|---|
| Resistor 26 | ohms | 3,300 |
| Resistor 27 | do | 3,300 |
| Resistor 94 | do | 18,000 |
| Resistor 95 | do | 18,000 |
| Resistor 24 | do | 6,800 |
| Resistor 25 | do | 6,800 |
| Resistor 34 | do | 560 |
| Resistor 35 | do | 560 |
| Capacitor 36 | micro-microfarads | 330 |
| Capacitor 37 | do | 330 |
| Resistor 97 | ohms | 10,000 |
| Resistor 100 | do | 10,000 |
| Capacitor 98 | microfarad | .1 |
| Capacitor 101 | do | .1 |

The amplitude of the trigger pulses may vary between 1.2 and 10 volts. If the amplitude of the trigger pulse amounts to 10 volts, stable operation may be obtained when the collector bias voltage varies between 24 and 34 volts while the bias voltage for emitter electrode 14 may vary between 3.5 and 4.4 volts while that applied to emitter electrode 18 may vary between 2.4 and 3.9 volts.

The multivibrator circuit of Fig. 5 is substantially independent of frequency, and the frequency of the pulses may, for example, vary between 60 cycles and 6,000 cycles and higher values. The multivibrator of Fig. 5 is accordingly adapted to count pulses of random spacing as well as pulses of either polarity at the input. Thus, a series of counter circuits, such as shown in Figure 5, may be connected in cascade and the output pulses obtained from the output terminals 57 of one unit may be fed into input terminals 96 of the succeeding unit to provide a chain of counters. It will be observed from the above circuit constants that the circuit of Fig. 5 is symmetrical and that corresponding resistors and capacitors have equal values.

There have thus been disclosed various multivibrator circuits of the semi-conductor type. The multivibrator circuits may either be self-oscillating, monostable or bistable. The multivibrator action is facilitated by the provision of positive feedback in each of the two semi-conductor devices included in the multivibrator circuit. The multivibrators are suitable for many applications, such as saw-tooth or pulse generators, counter circuits, and the like.

What is claimed is:

1. A multi-vibrator type circuit comprising a first and a second semi-conductor device, each including a semi-conducting body, a base electrode, a collector electrode and an emitter electrode for each device and in contact with their associated body, means for energizing said devices by predetermined bias voltages to said electrodes, a pair of impedance elements connected individually between each of said base electrodes and a point of fixed potential, thereby to provide negative resistance looking into said base electrodes, and a further impedance coupling element connected between the collector electrode of said first device and the base electrode of said second device.

2. A multi-vibrator circuit comprising a first and a second semi-conductor device, each including a semi-conducting body, a base electrode, a collector electrode and an emitter electrode for each device and in contact with their associated body, means for applying a reverse bias voltage between each of said collector electrodes and its associated base electrode and for applying a forward bias voltage between each of said emitter electrodes and its associated base electrode, a first pair of resistors connected individually between each of said base electrodes and a point of fixed potential, thereby to provide negative resistance looking into said base electrodes, a second pair of resistors connected individually in circuit with each of said collector electrodes, and a coupling impedance element connected between the collector electrode of said first device and the base electrode of said second device.

3. A multi-vibrator circuit comprising a first and a second semi-conductor device, each including a semi-conducting body, a base electrode, a collector electrode and an emitter electrode for each device and in contact with their associated body, means for applying a reverse bias voltage between each of said collector electrodes and its associated base electrode and for applying a forward bias voltage between each of said emitter electrodes and its associated base electrode, a first pair of resistors connected between each of said base electrodes and a point of fixed potential, thereby to provide negative resistance looking into said base electrodes, a second pair of resistors in circuit with said applying means and connected individually to each of said collector electrodes, and a coupling capacitor connected between the collector electrode of said first device and the base electrode of said second device.

4. A free-running multi-vibrator circuit comprising a first and a second semi-conductor device, each having a semi-conducting body, a base electrode, an emitter electrode and a collector electrode for each device and in contact with their associated body, a source of potential, a first pair of resistors connected individually between said base electrodes and one terminal of said source, thereby to provide negative resistance looking into said base electrodes, a second pair of resistors connected individually between said collector electrodes and the other terminal of said source, said source being so poled as to apply a reverse bias potential between each collector electrode and its associated base electrode, means for applying a forward bias potential between each emitter electrode and its associated base electrode, and a pair of impedance elements, each being connected between the collector electrode of one device and the base electrode of the other device to provide a cross connection between said devices.

5. A free-running multi-vibrator circuit comprising a first and a second semi-conductor device, each having a semi-conducting body, a base electrode, an emitter electrode and a collector electrode for each device and in contact with their associated body, a source of potential, a first pair of resistors connected individually between said base electrodes and one terminal of said source, thereby to provide negative resistance looking into said base electrodes, a second pair of resistors connected individually between said collector electrodes and the other terminal of said source, said source being so poled as to apply a reverse bias potential between each collector electrode and its associated base electrode, means for applying a forward bias potential between each emitter electrode and its associated base electrode, and a pair of capacitors, each being connected between the collector electrode of one device and the base electrode of the other device to provide a cross connection between said devices.

6. A free-running multivibrator circuit comprising a first and a second semi-conductor device, each having a semi-conducting body, a base electrode, an emitter electrode and a collector electrode for each device and in contact with their associated body, a source of potential, a first pair of resistors connected individually between said base electrodes and one terminal of said source, thereby to provide negative resistance looking into said base electrodes, a second pair of resistors connected individually between said collector electrodes and the other terminal of said source, said source being so poled as to apply a reverse bias potential between each collector electrode and its associated base electrode, means for applying a forward bias potential between each emitter electrode and its associated base electrode, a pair of capacitors, each being connected between the collector electrode of one device and the base electrode of the other device to provide a cross connection between said devices, and means for deriving output pulses from an electrode of said second device.

7. A multivibrator circuit as defined in claim 6, wherein means are provided for impressing positive trigger pulses on one of said emitter electrodes.

8. A multivibrator circuit as defined in claim 6, wherein means are provided for impressing negative trigger pulses on one of said base electrodes.

9. A multivibrator circuit comprising a first and a second semi-conductor device, each having a semi-conducting body, a base electrode, an emitter electrode and a collector electrode for each device and in contact with their associated body, a first pair of resistors connected individually between each of said base electrodes and a point of fixed potential, thereby to provide negative resistance looking into said base electrodes, a source of potential having one terminal connected to a point of fixed potential, a second pair of resistors connected individually between each of said collector electrodes and the other terminal of said source, said source being so poled as to apply a reverse bias potential between each collector electrode and its associated base electrode, means for applying a predetermined bias potential between the emitter and base electrodes of said first device and between the emitter and base electrodes of said second device, and a capacitor connected between the collector electrode of said first device and the base electrode of said second device.

10. A monostable multivibrator circuit comprising a first and a second semi-conductor device, each having a semi-conducting body, a base electrode, an emitter electrode and a collector electrode for each device and in contact with their associated body, a first pair of resistors connected individually between each of said base electrodes and a point of fixed potential, thereby to provide negative resistance looking into said base electrodes, a source of potential having one terminal connected to a point of fixed potential, a second pair of resistors connected individually between each of said collector electrodes and the other terminal of said source, said source being so poled as to apply a reverse bias potential between each collector electrode and its associated base electrode, means for applying a bias potential between the emitter and base electrodes of said first device to render said first device capable of conducting relatively lightly only, means for applying a bias potential between the emitter and base electrodes of said second device to render it capable of conducting relatively heavily, the resistor connected to the collector electrode of said second device having a smaller resistance than the resistor connected to the collector electrode of said first device, thereby to permit a larger flow of current through the collector electrode of said second device than through the collector electrode of said first device, and a capacitor connected between the collector electrode of said first device and the base electrode of said second device.

11. A multivibrator circuit as defined in claim 10, wherein means are provided for impressing pulses of negative polarity on one of said devices.

12. A multivibrator circuit as defined in claim 11 wherein said pulses are applied to the base electrode of said first device.

13. A multivibrator circuit as defined in claim 11, wherein said pulses are applied to the collector electrode of said second device.

14. A multivibrator circuit as defined in claim 10, wherein means are provided for impressing pulses of positive polarity on one of said devices.

15. A multivibrator circuit as defined in claim 14, wherein said pulses are applied to the collector electrode of said first device.

16. A multivibrator circuit as defined in claim 14, wherein said pulses are applied to the base electrode of said second device.

17. A monostable multivibrator circuit comprising a first and a second semi-conductor device, each having a semi-conducting body, a base electrode, an emitter electrode and a collector electrode for each device and in contact with their associated body, a first pair of resistors connected individually between each of said base electrodes and a point of fixed potential, thereby to provide negative resistance looking into said base electrodes, a source of potential having one terminal connected to a point of fixed potential, a second pair of resistors connected individually between each of said collector electrodes and the other terminal of said source, said source being so poled as to apply a reverse bias potential between each collector electrode and its associated base electrode, means connected to the base electrode of said first device for applying a bias potential between the emitter and base electrodes of said first device to render said first device capable of conducting relatively lightly only, means connected to the base electrode of said second device for applying a bias potential between the emitter and base electrodes of said second device to render it capable of conducting relatively heavily, the resistor connected to the collector electrode of said second device having a smaller resistance than the resistor connected to the collector electrode of said first device, thereby to allow a larger flow of current through the collector electrode of said second device than through the collector electrode of said first device, a further resistor connected between said point of fixed potential and said emitter electrodes, a capacitor connected between the collector electrode of said first device and the base electrode of said second device, and means for deriving output pulses from one of said devices.

18. A multivibrator circuit as defined in claim 17, wherein a third pair of resistors is provided, each being connected between said further resistor and one of said emitter electrodes.

19. A bistable multivibrator circuit comprising a first and a second semi-conductor device, each having a semi-conducting body, a base electrode, an emitter electrode and a collector electrode for each device and in contact with their associated body, a first pair of resistors connected individually between each of said base electrodes and ground, thereby to provide negative resistance looking into said base electrodes, a source of potential having one terminal grounded, a second pair of resistors connected individually between each of said collector electrodes and the other terminal of said source, said source being so poled as to apply a reverse bias potential between each of said collector electrodes and its associated base electrode, means for applying a forward bias potential between each of said emitter electrodes and its associated base electrode, a third pair of resistors, each being connected between the collector electrode of one of said devices and the base electrode of the other device, and means for applying trigger pulses simultaneously to corresponding electrodes of both devices.

20. A multivibrator circuit as defined in claim 19, wherein said trigger pulses are applied simultaneously to said emitter electrodes.

21. A bistable multivibrator circuit comprising a first and a second semi-conductor device, each having a semi-conducting body, a base electrode, an emitter electrode and a collector electrode for each device and in contact with their associated body, a first pair of resistors connected individually between each of said base electrodes and ground, thereby to provide negative resistance looking into said base electrodes, a source of potential having one terminal grounded, a second pair of resistors connected individually between each of said collector electrodes and the other terminal of said source, said source being so poled as to apply a reverse bias potential between each of said collector electrodes and its associated base electrode, means for applying a forward bias potential between each of said emitter electrodes and its associated base electrode, a third pair of resistors, each being connected between the collector electrode of one of said devices and the base electrode of the other device, a pair of capacitors, each shunting one of said third pair of resistors, and means for applying trigger pulses simultaneously to corresponding electrodes of both devices.

22. A bistable multivibrator circuit comprising a first and a second semi-conductor device, each having a semi-conducting body, a base electrode, an emitter electrode and a collector electrode for each device and in contact with their associated body, a first pair of resistors connected individually between each of said base electrodes and ground, thereby to provide negative resistance looking into said base electrodes, a source of potential having one terminal grounded, a second pair of resistors connected individually between each of said collector electrodes and the other terminal of said source, said source being so poled as to apply a reverse bias potential between each of said collector electrodes and its associated base electrode, means for applying a forward bias potential between each of said emitter electrodes and its associated base electrode, a third pair of resistors, each being connected between the collector electrode of one of said devices and the base electrode of the other device, means for applying trigger pulses simultaneously to corresponding electrodes of both devices, a differentiating network coupled to the collector electrode of the second device, and a clipper circuit coupled to said network for deriving output pulses of positive polarity.

EVERETT EBERHARD.

REFERENCES CITED

The following references are of record in the file of this patent:

UNITED STATES PATENTS

| Number | Name | Date |
|---|---|---|
| 2,459,723 | Schantz | Jan. 18, 1949 |
| 2,476,323 | Rack | July 19, 1949 |